United States Patent
Ash

(10) Patent No.: US 6,914,493 B2
(45) Date of Patent: Jul. 5, 2005

(54) NOISE RESISTANT LOW PHASE NOISE, FREQUENCY TRACKING OSCILLATORS AND METHODS OF OPERATING THE SAME

(75) Inventor: Darrell Lee Ash, Sachse, TX (US)

(73) Assignee: RF Monolithics, Inc., Dallas, TX (US)

( * ) Notice: Subject to any disclaimer, the term of this patent is extended or adjusted under 35 U.S.C. 154(b) by 0 days.

(21) Appl. No.: 09/801,452

(22) Filed: Mar. 8, 2001

(65) Prior Publication Data

US 2002/0125964 A1 Sep. 12, 2002

(51) Int. Cl.$^7$ .............................................. H03B 11/10
(52) U.S. Cl. .............................. 331/107 A; 331/177 V; 331/116 M; 331/116 R; 331/107 DP; 333/193; 333/194; 333/195; 310/313 R
(58) Field of Search ...................... 331/107 A, 177 V, 331/116 M, 116 R, 107 DP; 333/193, 194, 195; 310/313 R

(56) References Cited

U.S. PATENT DOCUMENTS

| | | | | |
|---|---|---|---|---|
| 4,560,951 A | * | 12/1985 | Futterer | 331/107 A |
| 4,581,592 A | | 4/1986 | Bennett | |
| 5,043,681 A | | 8/1991 | Tanemura et al. | 331/107 A |
| 5,608,360 A | | 3/1997 | Driscoll | 331/107 A |
| 6,239,664 B1 | | 5/2001 | Northam | 331/108 R |
| 6,426,683 B1 | * | 7/2002 | Gu et al. | 333/174 |

FOREIGN PATENT DOCUMENTS

| | | |
|---|---|---|
| DE | 196 34 622 | 3/1998 |
| EP | 0 386 498 | 9/1990 |
| GB | 2 047 491 A | 11/1980 |
| JP | 11-346142 | * 12/1999 |

OTHER PUBLICATIONS

"Standard Industrial Voltage Controlled Oscillators," Sawtek Inc., 1998. pp. 1–2.

Schmitt, R.F., et al: "Designing an EMC–Compliant UHF Oscillator," RF Design Cardiff Publishing Co., Englewood, CO, U.S., vol. 23, NR. 10, pp. 40, 42, 44, 46, 48, 50, 52, 54, XP001025221, ISSN: 0163–321X.

"Applications des Resonateurs a Ondes de Surface;" Electronique Radio Plans, SPE, Paris, France, 564; XP000477719; pp. 87–95.

Parker, T.E., et al: "Precision Surface–Acoustic–Wave (SAW) Oscillators," IEEE Transactions on Ultrasonics, Ferroelectrics and Frequency Control, IEEE Inc., New York, U.S., vol. 35, NR. 3, pp. 342–363, XP000047422, ISSN: 0885–3010.

Rohde, U.L.: "Designing SAW Resonators and DRO Oscillators Using Nonlinear Cad Tool," Frequency Control Symposium, 1995; 49th Proceedings of the 1995 IEEE International San Francisco, CA, U.S.A. 31 US. pp. 379–395; XP010155195; ISBN: 0–7803–2500–1.

Wessendorf, K, et al: "Oscillator Design Techniques Allow High–Frequency Applications," RF Design, Cardiff Publishing Co., Englewood, CO. U.S., vol. 21, NR. 3, pp. 38, 40, 42. 44. XP000755034. ISSN: 0163–321X.

Gonda, J., et al: "A Wide Pull Range Hybrid VCSO for Optical Transmission Networks," pp. 59–63, XP010090597.

Driscoll, M.M.: "Linear Frequency Tuning of SAW Resonators," pp. 191–194, XP010090619.

* cited by examiner

Primary Examiner—Arnold Kinkead

(57) ABSTRACT

To secure the benefits of a low phase noise, wide tune range SAW oscillator in noisy environments, the tunable two port SAW resonator circuit within the oscillator is employed in differential mode, connected to a differential amplifier circuit to create a differential oscillator. In the absence of any need for ground or power supply voltage level references, low phase noise/edge jitter is maintained even in hostile environments while providing sufficient tune range to track small frequency changes. The resulting differential mode SAW oscillator is thus well-suited for use, for instance, in clock recovery within SONET applications.

21 Claims, 2 Drawing Sheets

NOISE RESISTANT LOW PHASE NOISE, FREQUENCY TRACKING OSCILLATORS AND METHODS OF OPERATING THE SAME

RELATED APPLICATION

The present invention is related to the subject matter of commonly assigned, copending U.S. patent application Ser. No. 09/801,411, which is incorporated herein by reference.

TECHNICAL FIELD OF THE INVENTION

The present invention is directed, in general, to oscillator circuits and, more specifically, to employing low phase noise oscillators in noisy environments.

BACKGROUND OF THE INVENTION

Synchronous optical networks (SONETs), which provide very high data rate fiber optic links for communications, require low phase noise local oscillators for clock recovery. Phase noise, and the resulting effect of signal edge jitter in the local oscillator output, limits the clock speed or pulse rate for clock recovery by contributing to the required pulse width or duration for accurate operation. Additionally, the local oscillator employed in such applications should be frequency-tunable, allowing the local oscillator to be set or adjusted to a specific frequency to, for example, track frequency variations in the received clock signal. However, maintaining low phase noise and providing significant tune range for a local oscillator have proven to be conflicting objectives.

The related application identified above discloses a two port surface acoustic wave (SAW) resonator for local oscillators which provides both low phase noise and wide tune range (as compared to prior art oscillators employing SAW resonators). However, a local oscillator of the type disclosed—when employed, for example, for clock recovery in SONET applications—is typically mounted on a printed circuit board in close proximity with a number of digital devices operating at clock speeds equal to or greater than 1 gigahertz (GHz). Noise emanating from such digital devices can interfere with operation of the local oscillator regardless of how low the internal phase noise is within the local oscillator.

There is therefore a need in the art for low phase noise local oscillators tolerant of hostile environments.

SUMMARY OF THE INVENTION

To address the above-discussed deficiencies of the prior art, it is a primary object of the present invention to provide, for use in a local oscillator-driven circuit such as a phase lock loop, a technique to secure the benefits of a low phase noise, wide tune range SAW oscillator in noisy environments by employing the tunable two port SAW resonator circuit within the oscillator in differential mode, connected to a differential amplifier circuit to create a differential oscillator. In the absence of any need for ground or power supply voltage level references, low phase noise/edge jitter is maintained, due to common mode rejection, even in hostile environments while providing sufficient tune range to track small frequency changes. The resulting differential mode SAW oscillator is thus well-suited for use, for instance, in clock recovery within SONET applications.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 2A and 2B, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
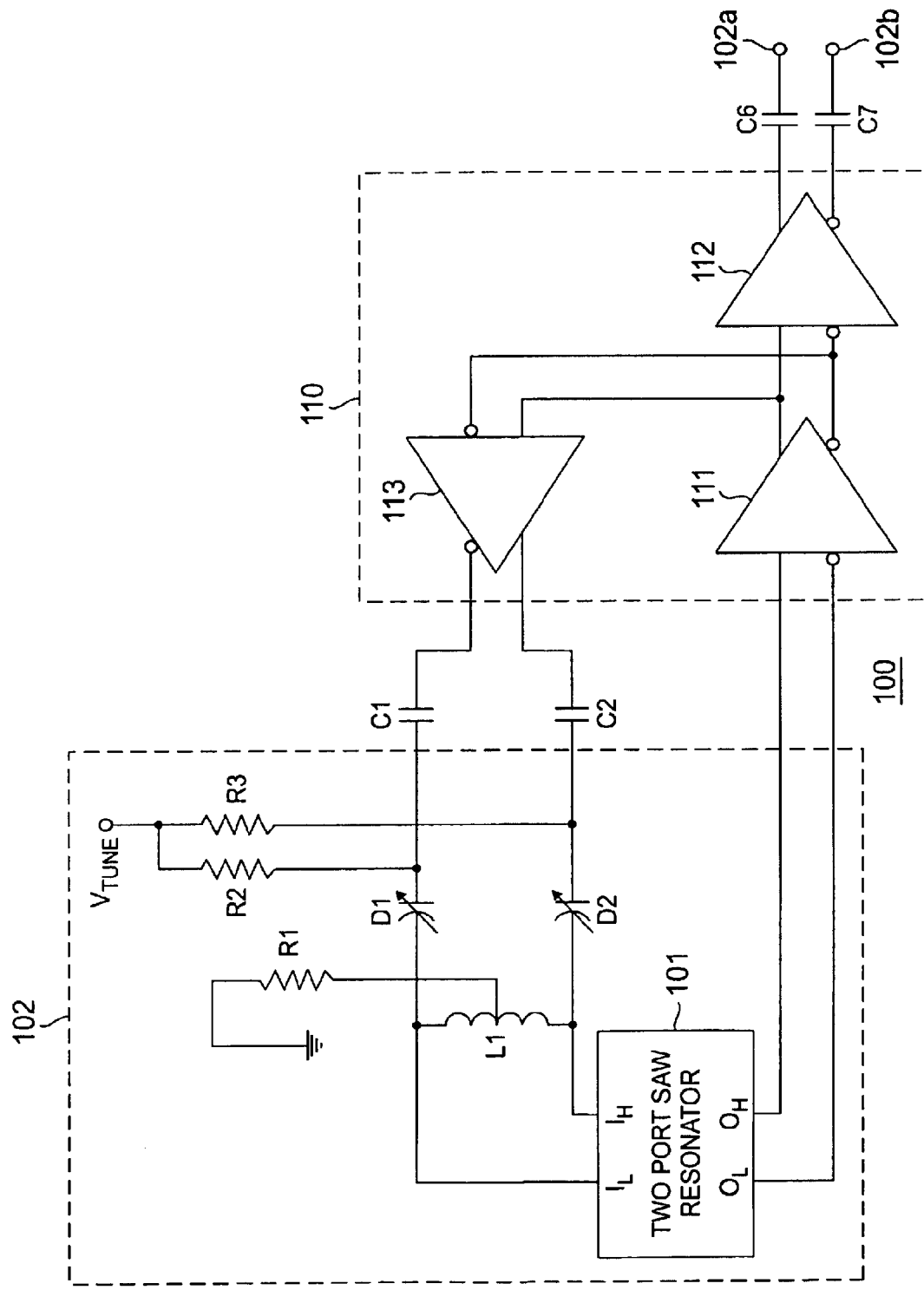
FIG. 1 depicts a circuit diagram for an exemplary differential mode oscillator including a two port tunable SAW resonator circuit according to one embodiment of the present invention.

FIG. 1 depicts a circuit diagram for an exemplary differential mode oscillator including a two port tunable SAW resonator circuit according to one embodiment of the present invention. Differential mode oscillator 100 includes a two port SAW resonator 101 having a high input $I_H$ and a low input $I_L$ as well as a high output $O_H$ and a low output $O_L$.

Figure 2A:
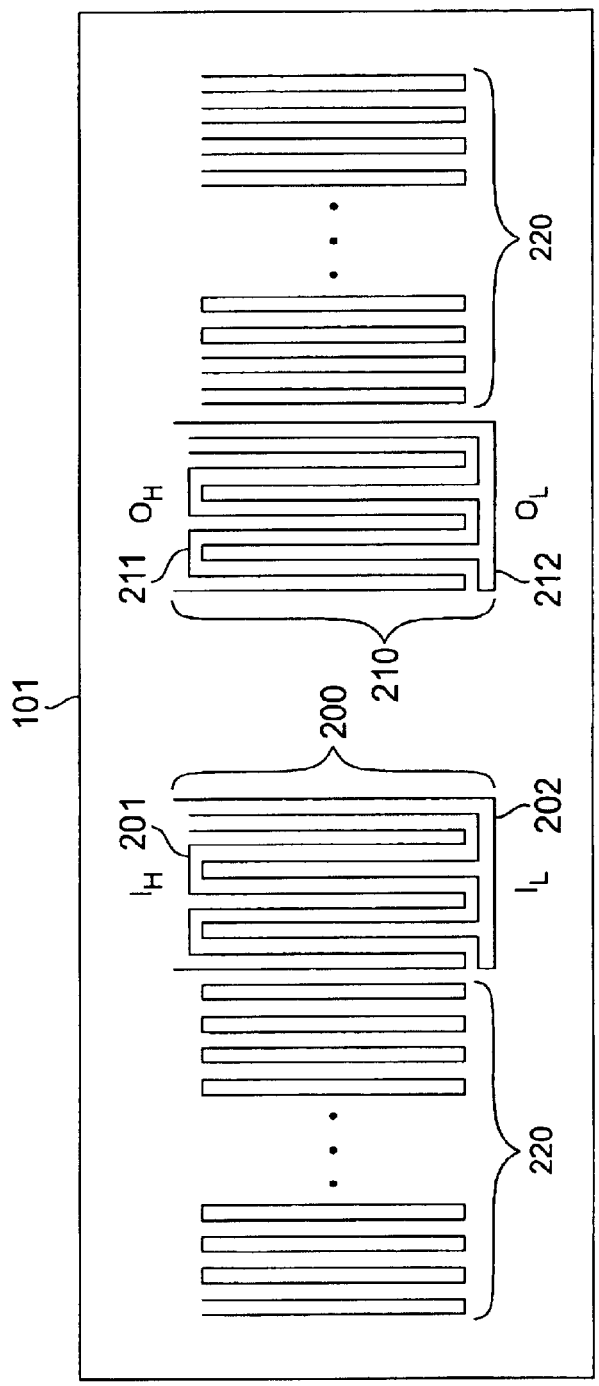
FIG. 2A illustrates in greater detail a two port SAW resonator employed within the exemplary differential mode oscillator according to one embodiment of the present invention.

FIG. 2A illustrates in greater detail the structure of a two port SAW resonator employed within the exemplary differential mode oscillator according to one embodiment of the present invention. Two port SAW resonator 101, constructed in accordance with the known art, includes: an input transducer 200 providing a first input terminal 201 for high input $I_H$ and a second input terminal 202 for low input $I_L$; an output transducer 210 providing a first input terminal 211 for high output $O_H$ and a second input terminal 212 for low output $O_L$; and reflectors 220.

Figure 2B:
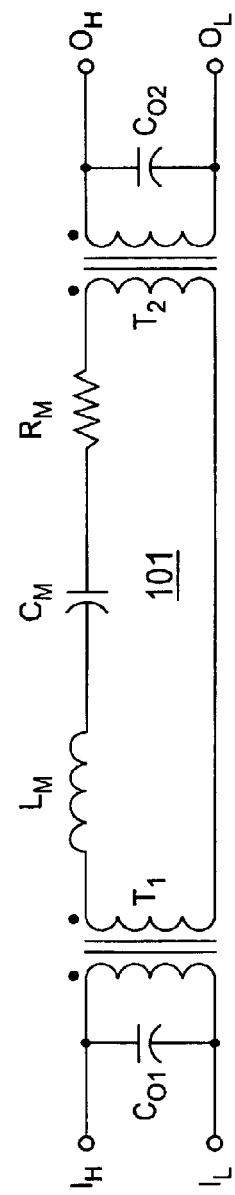
FIG. 2B illustrates in greater detail an equivalent circuit for a two port SAW resonator employed within the exemplary differential mode oscillator according to one embodiment of the present invention.

FIG. 2B illustrates in greater detail an equivalent circuit for a two port SAW resonator 101 employed within the exemplary differential mode oscillator according to one embodiment of the present invention. Within the frequency range of interest, the equivalent circuit of two port SAW resonator 101 includes a series resonator comprising a motional inductance $L_M$, a motional capacitance $C_M$ and a motional resistance $R_M$ all connected in series. The series resonator is coupled to the inputs $I_H$ and $I_L$ and the outputs $O_H$ and $O_L$ by one-to-one, non-phase shifting transformers $T_1$ and $T_2$. "Stray" capacitances $C_{O1}$, and $C_{O2}$, each formed by the internal parasitic and package capacitance (and any other unintentional capacitance) of the SAW resonator 101 as seen from one of the pairs of inputs $I_H$ and $I_L$ or outputs $O_H$ and $O_L$, are each connected across the respective inputs $I_H$ and $I_L$ and outputs $O_H$ and $O_L$ in parallel with transformers $T_1$ and $T_2$, respectively.

As disclosed in the related application, SAW resonator 101 is made tunable by connecting at least one inductance L1 across at least one of the pairs of inputs $I_H$ and $I_L$ or outputs $O_H$ and $O_L$ (across inputs $I_H$ and $I_L$ in the exemplary embodiment). The inductance-a center-tap inductor with a DC return for varactors D1 and D2 in the example shown—is thus connected in parallel with the stray capacitances $C_{O1}$, and is sized to effectively tune out (i.e., resonate with) stray capacitance $C_{O1}$ at the desired operational frequency. An additional inductance may optionally be connected across the outputs $O_H$ and $O_L$, sized to effectively tune out stray capacitances $C_{O2}$. An inductance may be serially-connected within one or both of the differential signal lines to an input $I_H$ or $I_L$, an output $O_H$ and $O_L$, or both, and sized to effectively tune out stray capacitance(s) $C_{O1}$ and/or $C_{O2}$.

By tuning out stray capacitance(s) $C_{O1}$ and/or $C_{O2}$, access is gained to the series resonator formed by motional inductance $L_M$, motional capacitance $C_M$ and motional resistance $R_M$, permitting direct tuning of the frequency at which the series resonator resonates. Variable capacitances D1 and D2, which are varactor diodes in the exemplary embodiment, are each connected to one of inputs $I_H$ and $I_L$ for this purpose. With stray capacitance $C_{O1}$ tuned out, capacitances D1 and D2 alter the resonant frequency of the series resonator circuit formed by the series resonator within the equivalent circuit for the SAW resonator 101 and variable capacitances D1 and D2. Accordingly, as the capacitance of tuning capacitances D1 and D2 decreases, the center frequency for the passband of the differential resonator circuit employing two port SAW resonator 101 increases. The desired tune range is thereby achieved with—because a high Q SAW device is employed—inherent low phase noise. If an inductance is employed coupled to the outputs $O_H$ and $O_L$ of SAW resonator 101, additional variable tuning capacitances (not shown) may be coupled to the outputs $O_H$ and $O_L$.

To produce a high Q SAW device, the motional capacitance $C_M$ should provide a high capacitive reactance, and therefore should be a very small capacitance on the order of femtoFarads (fF). For SONET clock recovery applications, some of which require a resonant frequency of 622 megahertz (MHz), a motional inductance $L_M$ on the order of milliHenrys (mH) is required. The stray capacitances $C_{O1}$ and $C_{O2}$ are (both) typically on the order of 1–2 picoFarads (pF). Accordingly, unless the stray capacitances $C_{O1}$ and $C_{O2}$ are tuned out by parallel inductance L1 as described above, efforts to form a directly tunable series resonator circuit with the series resonator within the equivalent circuit of the SAW resonator 101 by altering one or more capacitances connected in series with the SAW resonator 101 (such as variable tuning capacitances D1 and D2) will have no effect on the motional capacitance $C_M$ of the series resonator due to the difference in magnitudes of the stray capacitances $C_{O1}$ and $C_{O2}$ and the motional capacitance $C_M$.

Although necessarily small to achieve the desired resonant frequency and a high Q, the motional capacitance $C_M$ employed for a single pole, two port SAW resonator 101 of the type disclosed should be as large as possible to allow tuning capacitances D1 and D2 to significantly impact the series resonator and provide acceptable tune range. With a high impedance SAW resonator providing insertion loss on the order of 10 decibels (dB), the required motional capacitance is too small to be tuned. However, by utilizing an optimized, low impedance SAW resonator, the same Q may be achieved using a larger motional capacitance $C_M$. A suitable value for the motional capacitance $C_M$ is approximately 0.6 fF for a 622 MHz center frequency. A motional capacitance $C_M$ of approximately half that value would significantly reduce the tune range. For a motional capacitance $C_M$ of approximately 0.6 fF, a center tap inductor L1 having a total inductance of 56 nanoHenrys (nH) and tuning capacitances D1 and D2 having tuning ranges of approximately 2.0–0.4 pF may be employed.

In the exemplary embodiment, resistor R1 provides a direct current (DC) return through the center-tap of inductor L1 for biasing the varactors D1 and D2 while $V_{TUNE}$, through series resistors R2 and R3, biases (and sets the capacitance values for) varactor diodes D1 and D2.

A tunable SAW resonator circuit 102 is thus formed by SAW resonator 101, inductor L1, varactor diodes D1 and D2, and resistors R1, R2 and R3. In the exemplary embodiment, resistors R1, R2 and R3 each have a resistance of approximately 10 kiloOhms (kΩ). Capacitors C1, C2, C6 and C7, which are direct current (DC) blocking capacitors, each have a capacitance of about 100 picoFarads (pF). As noted above, however, additional inductances and variable tuning capacitances may be coupled to the outputs $O_H$ and $O_L$ of SAW resonator 101. Moreover, an inductance may be connected in series (with one of tuning capacitances D1 or D2) to one of the inputs $I_H$ or $I_L$ (or in series with one of the outputs $O_H$ or $O_L$) and, if appropriately sized, approximately tune out the stray capacitance(s). A combination of series-connected and shunt inductances may also be employed to tune out the stray capacitance(s).

In order to tolerate hostile and/or noisy environments, the two port SAW resonator 101 in the present invention is employed in a differential mode. SAW resonator 101 is balanced, with no requirement that either input or output be either grounded or connected to a power supply voltage. Accordingly, a commercially-available differential amplifier circuit 110, designed for Pierce oscillators and including three differential amplifiers 111, 112 and 113 in the example shown, may be connected to the tunable SAW resonator circuit to create differential oscillator 100. Differential mode oscillator 100 provides common mode rejection, with the level of common mode rejection—typically on the order of 30 decibels (dB)—being determined by the degree of balance within the oscillator loop. This common mode rejection provides substantial noise immunity in hostile environments. Differential mode oscillator 100 preferably employs positive emitter coupled logic (PECL) signal levels.

For SONET applications, both clock and inverse clock signals are usually desired. With a differential oscillator 100 in accordance with the present invention, generating both signals is simplified. Additionally, both output ports 102*a* and 102*b* may be employed separately as single-ended signals driving separate loads at power levels of +2 decibels with respect to a milliwatt (dBm).

The differential mode oscillator 100 of the present invention does not have any critical tuning elements. Variances, such as manufacturing variances, in the sizes of inductance L1, the stray capacitances $C_{O1}$ and $C_{O2}$, and tuning capacitances D1 and D2 may be tolerated without significant performance degradation. For example, the tuning capacitances D1 and D2 within the exemplary embodiment need only have a capacitance of between 4 picoFarads (pF) and 2 picoFarads for low voltages, and less than approximately 0.4 pF for high voltages. The performance of oscillator 100 is almost entirely dependent on the SAW resonator characteristics, with no other critical requirements other than greater than unity gain, which is easily provided by a high gain amplifier.

The differential mode SAW oscillator 100 of the present invention, which is a voltage controlled SAW oscillator (VCSO), may be advantageously employed within the phase lock loop (PLL) of a clock recovery circuit, particularly for SONET applications. SAW oscillator 100 exhibits very low phase noise and edge jitter while providing sufficient tune range to track slight changes (error) in frequency during operation, allowing for manufacturing variances, and accommodating temperature variations.

Although the present invention has been described in detail, those skilled in the art should understand that they can make various changes, substitutions and alterations herein without departing from the spirit and scope of the invention in its broadest form.

What is claimed is:

1. For use in an oscillator, a two port differential mode SAW resonator circuit for providing low phase noise in hostile environments comprising:

a two port SAW resonator having two inputs and two outputs;

at least one inductance coupled to one or more inputs or outputs of the SAW resonator, wherein the at least one inductance is connected and sized to reduce a stray capacitance seen across the inputs or outputs within an equivalent circuit for the SAW resonator at a selected frequency such that any residual stray capacitance seen across the inputs or outputs has a magnitude less than a magnitude of a motional capacitance within the equivalent circuit for the SAW resonator; and at least one variable tuning capacitance connected in series with the one or more inputs or outputs of the SAW resonator, wherein the at least one tuning capacitance may be employed to alter a resonant frequency of the SAW resonator circuit.

2. The two port differential mode SAW resonator circuit as set forth in claim 1 wherein the at least one inductance further comprises an inductor connected across the inputs of the SAW resonator.

3. The For use in an oscillator, a two port differential mode SAW resonator circuit for providing low phase noise in hostile environments comprising:

two port SAW resonator having two inputs and two outputs;

at least one inductance coupled to one or more inputs or outputs of the SAW resonator, wherein the at least one inductance is connected and sized to approximately tune out a stray capacitance seen across the inputs or outputs within an equivalent circuit for the SAW resonator at a selected frequency, wherein the at least one inductance further comprises an inductor connected across the inputs of the SAW resonator and wherein the inductor further comprises a center tap inductor connected at a center tap through a resistance to a ground voltage level; and at least one variable tuning capacitance connected in series with the one or more inputs or outputs of the SAW resonator, wherein the at least one tuning capacitance may be employed to alter a resonant frequency or the SAW resonator circuit.

4. The two port differential mode SAW resonator circuit as set forth in claim 1 wherein the at least one variable tuning capacitance further comprises:

a first varactor diode serially connected within a first differential signal line to a first input of the SAW resonator; and a second varactor diode serially connected within a second differential signal line to a second input of the SAW resonator.

5. For use in an oscillator, a two port differential mode SAW resonator circuit for providing low phase noise in hostile environments comprising:

a two port SAW resonator having two inputs and two outputs;

at least one inductance coupled to one or more inputs or outputs of the SAW resonator, wherein the at least one inductance is connected and sized to approximately tune out a stray capacitance seen across the inputs or outputs within an equivalent circuit for the SAW resonator at a selected frequency;

at least one variable tuning capacitance connected in series with the one or more inputs or outputs of the SAW resonator, wherein the at least one tuning capacitance may be employed to alter a resonant frequency of the SAW resonator circuit, wherein the at least one variable tuning capacitance further comprises:

a first varactor diode serially connected within a first differential signal line to a first input of the SAW resonator; and a second varactor diode serially connected within a second differential signal line to a second input of the SAW resonator;

a first resistor connecting the first differential signal line to a tuning voltage level; and a second resistor connecting the second differential signal line to the tuning voltage level.

6. The two port differential mode SAW resonator circuit as set forth in claim 5, further comprising:

blocking capacitances serially connected within each of the first and second differential signal lines.

7. The two port differential mode SAW resonator circuit as set forth in claim 1 wherein adjusting a capacitance of the at least one variable tuning capacitance alters the resonant frequency for the SAW resonator circuit by altering a total capacitance for a series resonator circuit formed by a series resonator within the equivalent circuit for the SAW resonator and the at least one tuning capacitance.

8. An oscillator comprising:
a differential amplifier; and
a two port differential mode SAW resonator circuit connected in a series loop with the differential amplifier for providing low phase noise in hostile environments comprising:
  a two port SAW resonator having two inputs and two outputs;
  at least one inductance coupled to one or more inputs or outputs of the SAW resonator, wherein the at least one inductance is connected and sized to reduce a stray capacitance seen across the inputs or outputs within an equivalent circuit for the SAW resonator at a selected frequency such that any residual stray capacitance seen across the inputs or outputs has a magnitude less than a magnitude of a motional capacitance within the equivalent circuit for the SAW resonator; and
  at least one variable tuning capacitance connected in series with the one or more inputs or outputs of the SAW resonator, wherein the at least one tuning capacitance may be employed to alter a resonant frequency of the SAW resonator circuit.

9. The oscillator as set forth in claim 8 wherein the at least one inductance further comprises an inductor connected across the inputs of the SAW resonator.

10. An oscillator comprising:
a differential amplifier; and
a two port differential mode SAW resonator circuit connected in a series loop with the differential amplifier for providing low phase noise in hostile environments comprising:
  a two port SAW resonator having two inputs and two outputs;
  at least one inductance coupled to one or more inputs or outputs of the SAW resonator, wherein the at least one inductance is connected and sized to approximately tune out a stray capacitance seen across the inputs or outputs within an equivalent circuit for the SAW resonator at a selected frequency; and
  at least one variable tuning capacitance connected in series with the one or more inputs or outputs of the SAW resonator, wherein the at least one tuning capacitance may be employed to alter a resonant frequency of the SAW resonator circuit,
wherein the inductor further comprises a center tap inductor connected at a center tap through a resistance to a ground voltage level.

11. The oscillator as set forth in claim 8 wherein the at least one variable tuning capacitance further comprises:
  a first varactor diode serially connected within a first differential signal line to a first input of the SAW resonator; and
  a second varactor diode serially connected within a second differential signal line to a second input of the SAW resonator.

12. An oscillator comprising:
a differential amplifier;
a two port differential mode SAW resonator circuit connected in a series loop with the differential amplifier for providing low phase noise in hostile environments comprising:
  a two port SAW resonator having two inputs and two outputs;
  at least one inductance coupled to one or more inputs or outputs of the SAW resonator, wherein the at least one inductance is connected and sized to approximately tune out a stray capacitance seen across the inputs or outputs within an equivalent circuit for the SAW resonator at a selected frequency; and
  at least one variable tuning capacitance connected in series with the one or more inputs or outputs of the SAW resonator, wherein the at least one tuning capacitance may be employed to alter a resonant frequency of the SAW resonator circuit, wherein the at least one variable tuning capacitance further comprises:
    a first varactor diode serially connected within a first differential signal line to a first input of the SAW resonator; and
    a second varactor diode serially connected within a second differential signal line to a second input of the SAW resonator; and
  a first resistor connecting the first differential signal line to a tuning voltage level; and
  a second resistor connecting the second differential signal line to the tuning voltage level.

13. The oscillator as set forth in claim 12, further comprising:
  blocking capacitances serially connected within each of the first and second differential signal lines.

14. The oscillator as set forth in claim 8 wherein adjusting a capacitance of the at least one variable tuning capacitance alters the resonant frequency for the SAW resonator circuit by altering a total capacitance for a series resonator circuit formed by a series resonator within the equivalent circuit for the SAW resonator and the at least one tuning capacitance and wherein the differential amplifier and the differential mode SAW resonator circuit form a differential amplifier providing common mode rejection.

15. For use in an oscillator, a method of tuning a SAW resonator circuit while maintaining low phase noise comprising the steps of:
  applying a differential input signal to a two port differential mode SAW resonator having two inputs and two outputs, wherein a stray capacitance seen across the inputs or outputs within an equivalent circuit for the SAW resonator is reduced at a selected frequency such that any residual stray capacitance seen across the inputs or outputs has a magnitude less than a magnitude of a motional capacitance within the equivalent circuit for the SAW resonator; and
  adjusting a total capacitance for a series resonator circuit formed by a series resonator within the equivalent circuit for the SAW resonator and at least one variable tuning capacitance connected to an input or output of the SAW resonator.

16. The method of claim 15 further comprising:
  exciting at least one inductance coupled across the inputs or outputs of the SAW resonator, wherein the at least one inductance is connected and sized to approximately tune out the stray capacitance at the selected frequency.

17. For use in an oscillator, a method of tuning a SAW resonator circuit while maintaining low phase noise comprising:
  applying a differential input signal to a two port differential mode SAW resonator having two inputs and two outputs, wherein a stray capacitance seen across the inputs or outputs within an equivalent circuit for the SAW resonator is approximately tuned out at a selected frequency;

adjusting a total capacitance for a series resonator circuit formed by a series resonator within the equivalent circuit for the SAW resonator and at least one variable tuning capacitance connected to an input or output of the SAW resonator; and exciting at least one inductance coupled across the inputs or outputs of the SAW resonator, wherein the at least one inductance is connected and sized to approximately tune out the stray capacitance at the selected frequency and wherein the at least one inductance is a center-tap inductor connected at the center tap through a resistance to a ground voltage level.

18. The method of claim 15 wherein the step of adjusting a total capacitance for a series resonator circuit formed by a series resonator within the equivalent circuit for the SAW resonator and at least one variable tuning capacitance connected to an input or output of the SAW resonator further comprises:

altering a tuning voltage applied to first and second varactor diodes serially connected within first and second differential signal lines to the inputs or outputs of the SAW resonator.

19. The method of claim 15 further comprising:

employing a differential oscillator including the SAW resonator circuit.

20. The method of claim 19 further comprising:

altering a frequency at which the differential oscillator oscillates by adjusting the total capacitance for the series resonator circuit.

21. For use in an oscillator, a two port differential mode SAW resonator circuit for providing low phase noise in hostile environments comprising:

a two port SAW resonator having two inputs and two outputs;

at least one inductance coupled to one or more inputs or outputs of the SAW resonator; and at least one variable tuning capacitance connected in series with the one or more inputs or outputs of the SAW resonator, wherein the at least one inductance is connected and sized to increase a tune range of a resonant circuit formed by a motional capacitance, a motional inductance and a motional resistance within an equivalent circuit for the SAW resonator and the at least one variable capacitance such that any residual stray capacitance seen at the inputs or outputs has a magnitude less than a magnitude of a motional capacitance within the equivalent circuit for the SAW resonator.

* * * * *

UNITED STATES PATENT AND TRADEMARK OFFICE
CERTIFICATE OF CORRECTION

PATENT NO. : 6,914,493 B2 Page 1 of 1
DATED : July 5, 2005
INVENTOR(S) : Darrell Lee Ash It is certified that error appears in the above-identified patent and that said Letters Patent is hereby corrected as shown below:

<u>Column 5,</u>
Line 65, delete "The";

<u>Column 6,</u>
Line 1, insert -- a -- before "two", first occurrence.

Signed and Sealed this

Thirtieth Day of May, 2006

JON W. DUDAS
*Director of the United States Patent and Trademark Office*